(12) United States Patent
Yueh et al.

(10) Patent No.: US 7,005,227 B2
(45) Date of Patent: Feb. 28, 2006

(54) ONE COMPONENT EUV PHOTORESIST

(75) Inventors: Wang Yueh, Portland, OR (US); Heidi Cao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/762,031

(22) Filed: Jan. 21, 2004

(65) Prior Publication Data

US 2005/0158650 A1   Jul. 21, 2005

(51) Int. Cl.
*G03F 7/023* (2006.01)
*G03F 7/30* (2006.01)

(52) U.S. Cl. .................. 430/168; 430/190; 430/326
(58) Field of Classification Search ............... 430/190, 430/168, 326, 193
See application file for complete search history.

(56) References Cited

U.S. PATENT DOCUMENTS

| | | | |
|---|---|---|---|
| 5,302,488 A | * | 4/1994 | Roeschert et al. .......... 430/190 |
| 5,326,826 A | * | 7/1994 | Roeschert et al. ....... 525/326.5 |
| 5,705,308 A | * | 1/1998 | West et al. ................. 430/165 |
| 6,218,083 B1 | * | 4/2001 | McCullough et al. ....... 430/326 |
| 6,783,914 B1 | * | 8/2004 | Fedynyshyn ................ 430/190 |
| 6,824,947 B1 | * | 11/2004 | Ishizuka et al. ............ 430/157 |

* cited by examiner

*Primary Examiner*—John S. Chu
(74) *Attorney, Agent, or Firm*—Trop, Pruner & Hu, P.C.

(57) ABSTRACT

In one embodiment, a photoactive compound may be attached to a polymer backbone. This embodiment may be more resistant to the generation of reactive outgassing components and may exhibit better contrast.

8 Claims, 1 Drawing Sheet

ONE COMPONENT EUV PHOTORESIST

BACKGROUND

This invention relates generally to the manufacture of semiconductor integrated circuits and, particularly, to photolithography processes for manufacturing such circuits.

In the manufacture of semiconductor integrated circuits, a photoresist film is formed over a semiconductor wafer. The photoresist film may be irradiated so that some regions of the photoresist film are either harder or easier to dissolve in aquesios base developer. As a result, a pattern can be repeatedly transferred to the semiconductor wafer via the photoresist film. After developing, the photoresist film may be used as a mask for etching desired features in the underlying layers of the semiconductor wafer.

Advances in photolithography techniques utilized to transfer patterns to photoresist have enabled increasingly smaller patterns to be transferred. This means that smaller integrated circuit features can be formed in integrated circuits. As a result, more elements can be put in a given area on a semiconductor integrated circuit. One result of these advances has been to reduce the cost of integrated circuits.

One advanced photolithography technology is extreme ultraviolet technology (EUV). For current chemically amplified photoresists, the photoacid generators (PAGs)are the components in the resist formulation. These photoacid generators generate acids upon exposure to appropriate irradiation. The generated acids will cleave the protecting groups on the resins and switch the photoresist's solubility in the base aqueous developer.

Photoacid generators developed for prior photo-lithography technologies may achieve relatively good quantum yields at the required wavelengths. However, these photoacid generators will outgas under extreme ultraviolet irradiation under vacuum. Outgassing is the release of gases or vapors by a material over time. Outgassing may result in degradation of the lens used in the extreme ultraviolet optics due to photoresist fragment deposition related to outgassing.

Currently, photoacid generator technology has focused primarily on perfluoroalkyl sulfonate (PFAS) anion and phenyl-based cation photoacid generators. However, the cation portion of the photoacid generators of this type will outgas after extreme ultraviolet irradiation.

Traditionally, photoactive compounds, such as diazonapthoquinone (DNQ), with Novalac have been used I-line (and G-line) as a two component photoresist. However, the contrast achievable with such a structure limits the resolution of that photoresist.

As the acid diffusion length decreases, chemical amplification may be less efficient. The typical spacing between de-protecting groups is typically a few nanometers apart. When the acid diffusion length that is required to meet resolution targets becomes equivalent to the spacing between protecting groups, the photoacid generator no longer acts a chemical amplifier because the photoacid generator interacts with only one de-protecting group on average.

Since chemically amplified resists reach a point where they are no longer efficient, alternatives to chemical amplification are needed. Thus, there is a need for ways to enable even smaller feature sizes to be transferred by photolithographic processes.

DETAILED DESCRIPTION

Figure 1:
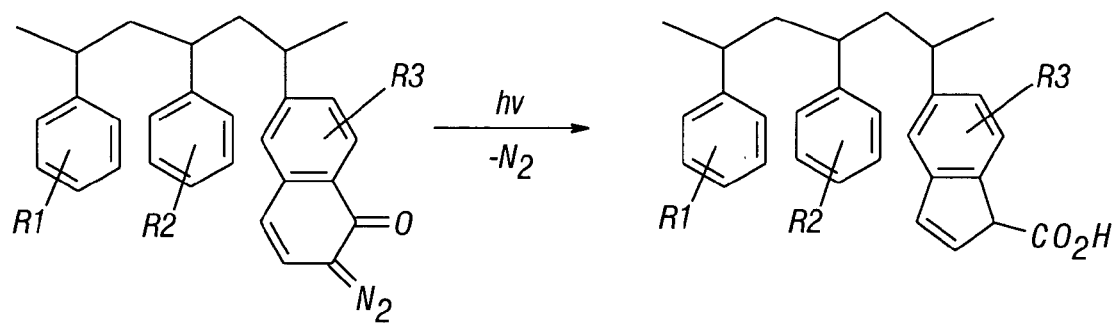
FIG. 1 is a depiction of a chemical reaction in accordance with one embodiment of the present invention.

In one embodiment, by introducing photoactive compounds into the polymer backbone of the photoresist, outgassing of photo-reactive materials may be reduced. Photoactive compounds, such as diazonaphthoquinone (DNQ), may be incorporated on a polymer backbone via a conventional polymerization reaction, using initiators (such as AIBN, and phenyl peroxide, etc.). The photoactive compounds reduce the amount of outgassing of reactive materials. Since the diffusion of the photoacid generator is believed to be a primary source of line width roughness of chemically amplified photoresists, use of photoactive compounds on the polymer backbone may reduce line width roughness because large molecules will not diffuse over any significant distance.

As the photoactive compounds may be incorporated into the polymer backbone, a resist with high sensitivity and high contrast may be provided. Moreover, the breakdown of the photochemistry does not generate hydrocarbons (such as isobutene) as de-blocking groups. Instead, with DNQ, nitrogen will be released via Wolff rearrangement. However, nitrogen is not reactive and will not cause degradation of optical components.

Since no photoacid generator need be utilized, in one embodiment, a one component chemically amplified photoresist is achieved. Previously, DNQ was used in a two component photoresist including Novalac and DNQ.

By incorporating the photoactive compound on a polymer backbone, the solubility switch may be delayed, during developing, until a sufficient number of photoactive compounds on the polymer backbone are activated to switch the solubility of the entire polymer. Dramatic increases in contrast may be achieved in some embodiments. Thus, by increasing the molecular size of the DNQ composite molecule contrast may be improved.

Referring to FIG. 1, when the photoactive compound, such as DNQ, is provided on the polymer backbone, carbonyl acid is formed upon exposure to radiation, such as extreme ultraviolet radiation. R1 may be hydrogen or an alkyl, R2 may be hydrogen or hydroxyl, and R3 may be hydrogen, an alkyl, or other ballast group in one embodiment of the present invention. R1, R2, and R3 indicate moieties that may be attached to a ring. In some embodiments, R1 may be different from R2 to increase contrast. R1 and R2 may be switched.

While nitrogen is released, that nitrogen does not contaminate the optics. In addition, photoacid generator diffusion is eliminated.

Vinyl-hydroxystyrene may be copolymerized with vinyl-DNQ on the same backbone. The DNQ will provide the change in solubility between the exposed and unexposed areas. Upon exposure, the backbone polymers switch solubility in developer from non-dissolving to well dissolving. The photoactive compound on the polymer backbone may be provided in a quantity and placement to optimize the sensitivity and contrast of the resist. In one embodiment, the DNQ may be above 10 to 20% on a molar basis. Other desirable resist properties are provided by the functionalized hydroxystyrene groups. For example phenols will improve adhesion and miscibility in a developer.

In addition, electron producing groups may be placed in close proximity to the photoactive compound structures to increase sensitivity. Since extreme ultraviolet chemistry occurs primarily by secondary electrons that are produced when extreme ultraviolet photons absorb radiation, strategically placing extreme ultraviolet absorbing groups near the photoactive compound structures increases the efficiency of the photoactive compound chemistry.

Using DNQ-based polymers may reduce or eliminate outgassing. Currently, the main materials that are outgassing are those which are reactive, such as photoacid generators and deprotecting groups. For a one component photoactive compound, a reaction may occur under extreme ultraviolet radiation that produces only a small nitrogen molecule which will not deposit on optics surfaces.

In addition, miscibility between components is not an issue with a one component chemistry. Phase separation (Photoactive compound precipitates out from the formulation) may be an issue with two component systems such as Novalac and DNQ.

While the present invention may be applicable to a variety of photolithography processes, it may be particularly applicable to forming extreme ultraviolet photoresist. It may also be integrated into 193 nanometer and 248 nanometer photoresists as well.

While the present invention has been described with respect to a limited number of embodiments, those skilled in the art will appreciate numerous modifications and variations therefrom. It is intended that the appended claims cover all such modifications and variations as fall within the true spirit and scope of this present invention.

The invention claimed is:

1. A method comprising:
   forming a photoresist by attaching a photoactive compound including diazonaphthoquinone to a polymer backbone; and
   exposing said photoresist to extreme ultraviolet radiation.

2. The method of claim 1 including attaching diazonaphthoquinone as the photoactive compound.

3. The method of claim 2 including attaching hydroxystyrene groups to said backbone.

4. The method of claim 3 including attaching a first moiety to one hydroxystyrene group and a second moiety, different from said first moiety, to a second hydroxystyrene group.

5. The method of claim 4 including selecting said moieties from hydrogen, hydroxyl, and alkyl.

6. The method of claim 1 including using from 10 to 20% of diazonaphthoquinone on a molar basis.

7. The method of claim 2 including forming non-reactive compounds upon exposure to radiation.

8. The method of claim 4 including forming nitrogen upon irradiation.

* * * * *